United States Patent
Goto

(10) Patent No.: US 7,960,703 B2
(45) Date of Patent: Jun. 14, 2011

(54) CHARGED-PARTICLE BEAM LITHOGRAPHY APPARATUS AND DEVICE MANUFACTURING METHOD

(75) Inventor: Susumu Goto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 371 days.

(21) Appl. No.: 12/184,586

(22) Filed: Aug. 1, 2008

(65) Prior Publication Data

US 2009/0057571 A1    Mar. 5, 2009

(30) Foreign Application Priority Data

Sep. 4, 2007 (JP) ................................. 2007-229454

(51) Int. Cl.
*H01J 37/12* (2006.01)

(52) U.S. Cl. .............................. 250/396 R; 250/396 ML

(58) Field of Classification Search ............. 250/492.23, 250/491.1, 492.2, 310, 311, 396 R
See application file for complete search history.

(56) References Cited

U.S. PATENT DOCUMENTS

| | | | | |
|---|---|---|---|---|
| 4,785,187 A | 11/1988 | Kariya et al. | ............... | 250/491.1 |
| 4,812,662 A | 3/1989 | Goto et al. | ................. | 250/491.1 |
| 4,939,371 A | 7/1990 | Goto | ............................. | 250/397 |
| 5,747,819 A * | 5/1998 | Nakasuji et al. | ......... | 250/492.23 |
| 5,770,863 A * | 6/1998 | Nakasuji | ..................... | 250/492.2 |
| 5,864,142 A | 1/1999 | Muraki et al. | .............. | 250/491.1 |
| 5,912,469 A * | 6/1999 | Okino | ....................... | 250/492.23 |
| 5,929,454 A | 7/1999 | Muraki et al. | .............. | 250/491.1 |
| 6,069,363 A * | 5/2000 | Golladay | ................... | 250/396 R |
| 6,429,441 B1 * | 8/2002 | Nakasuji | .................... | 250/492.2 |
| 6,452,193 B1 * | 9/2002 | Goto | ............................. | 250/491.1 |
| 6,465,783 B1 * | 10/2002 | Nakasuji | ....................... | 250/311 |
| 6,831,260 B2 | 12/2004 | Goto | ............................. | 250/200 |
| 6,903,337 B2 | 6/2005 | Kienzle et al. | | |
| 7,034,314 B2 | 4/2006 | Goto | ....................... | 250/396 ML |
| 2007/0023654 A1 * | 2/2007 | Kamimura et al. | ........... | 250/310 |

FOREIGN PATENT DOCUMENTS

| | | |
|---|---|---|
| JP | 2000-232052 | 8/2000 |
| JP | 2006-221870 A | 8/2006 |
| KR | 2003-0004116 A | 1/2003 |

OTHER PUBLICATIONS

Korean Office Action issued Apr. 29, 2010, in corresponding Korean patent application No. 10-2008-0081816.

* cited by examiner

*Primary Examiner* — Robert Kim
*Assistant Examiner* — Johnnie L Smith
(74) *Attorney, Agent, or Firm* — Fitzpatrick, Cella, Harper & Scinto

(57) ABSTRACT

A charged-particle beam lithography apparatus includes a projection system that projects a charged-particle beam, and images a pattern on a substrate with the projected charged-particle beam. The projection system has a symmetrical magnetic doublet lens configured to generate a magnetic field, and an electro-static lens configured to generate an electrical field superimposed on the magnetic field. The electro-static lens includes an electrode configured to apply, on at least the pupil plane of the symmetrical magnetic doublet lens, a potential to accelerate a charged-particle beam that has entered the symmetrical magnetic double lens.

5 Claims, 3 Drawing Sheets

CHARGED-PARTICLE BEAM LITHOGRAPHY APPARATUS AND DEVICE MANUFACTURING METHOD

This application claims the benefit of Japanese Patent Application No. 2007-229454, filed Sep. 4, 2007, which is hereby incorporated by reference herein in its entirety.

BACKGROUND OF THE INVENTION

1. Field of the Invention

The present invention relates to a charged-particle beam lithography apparatus and a device manufacturing method.

2. Description of the Related Art

An electron beam lithography apparatus as a type of charged-particle beam lithography apparatus has conventionally been developed with an aim to increase the throughput. An improvement in throughput requires increasing the exposure beam current, which faces a problem attributed to the Coulomb effect. The Coulomb effect has the demerit of blurring a convergent electron beam due to the repulsive force between electrons, resulting in degradation in resolution. For this reason, the resolution and the throughput have a trade-off relationship.

To increase the exposure beam current while suppressing aberration due to the Coulomb effect to a considerable degree, a method of decreasing the average density of the exposure beam current to some extent is available. This method reduces the Coulomb effect by decreasing the current density by irradiating an exposure region (subfield) as relatively large as about several hundred micrometers square, thus maintaining a given throughput.

Another method sets a relatively large convergent angle of an electron beam on the sample surface. This method applies a decelerating electrical field between the projection lens and the sample. It is expected to reduce the aberration of the projection lens, and to suppress a decrease in resist sensitivity and heat generation, and deterioration of the sample surface, by irradiating the sample surface with a charged-particle beam at a low speed.

Japanese Patent Laid-Open No. 2000-232052 discloses a scheme that reduces aberration by a decelerating an electrical field. The scheme disclosed in Japanese Patent Laid-Open No. 2000-232052 applies decelerating electrical fields between the transfer mask and the projection optical system, and between the projection optical system and the wafer in an electron beam exposure apparatus.

Although the method of decreasing the average density of the exposure beam current is applied to an electron beam exposure apparatus, it requires a transfer mask, which entails an additional cost.

In the method of setting a relatively large convergent angle of an electron beam, geometrical aberration increases as the exposure area (angle of view) increases. To attain high resolution, the aberration performance of the projection lens must meet a strict demand. Still worse, a disturbance of the decelerating electrical field occurs due to factors associated with, for example, the shape of the sample surface and a member disposed on the stage, so parasitic aberration and a positional shift of the charged-particle beam occur. The scheme disclosed in Japanese Patent Laid-Open No. 2000-232052 may cause a disturbance of the decelerating electrical field due to factors associated with, for example, the shapes of the wafer surface and its vicinity, and a member disposed on the stage, so parasitic aberration occurs, resulting in degradation in resolving performance.

SUMMARY OF THE INVENTION

It is an object of the present invention to provide a charged-particle beam lithography apparatus, which attains a high throughput, while suppressing blurring of a charged-particle beam due to the Coulomb effect.

According to the present invention, a charged-particle beam lithography apparatus comprises a projection system that projects a charged-particle beam, and images a pattern on a substrate with the projected charged-particle beam, wherein the projection system comprises a symmetrical magnetic doublet lens configured to generate a magnetic field, and an electro-static lens configured to generate an electrical field superimposed on the magnetic field, and the electro-static lens includes an electrode configured to apply, on at least a pupil plane of the symmetrical magnetic doublet lens, a potential to accelerate the charged-particle beam that has entered the symmetrical magnetic doublet lens.

According to the present invention, it is possible to provide a charged-particle beam lithography apparatus that attains a high throughput while suppressing blurring of a charged-particle beam due to the Coulomb effect.

Further features of the present invention will become apparent from the following description of exemplary embodiments with reference to the attached drawings.

DESCRIPTION OF THE EMBODIMENT

A charged-particle beam lithography apparatus according to an embodiment of the present invention will be described below with reference to the accompanying drawings. The lithography apparatus according to the present invention includes, for example, an imaging apparatus and an exposure apparatus.

Figure 1:
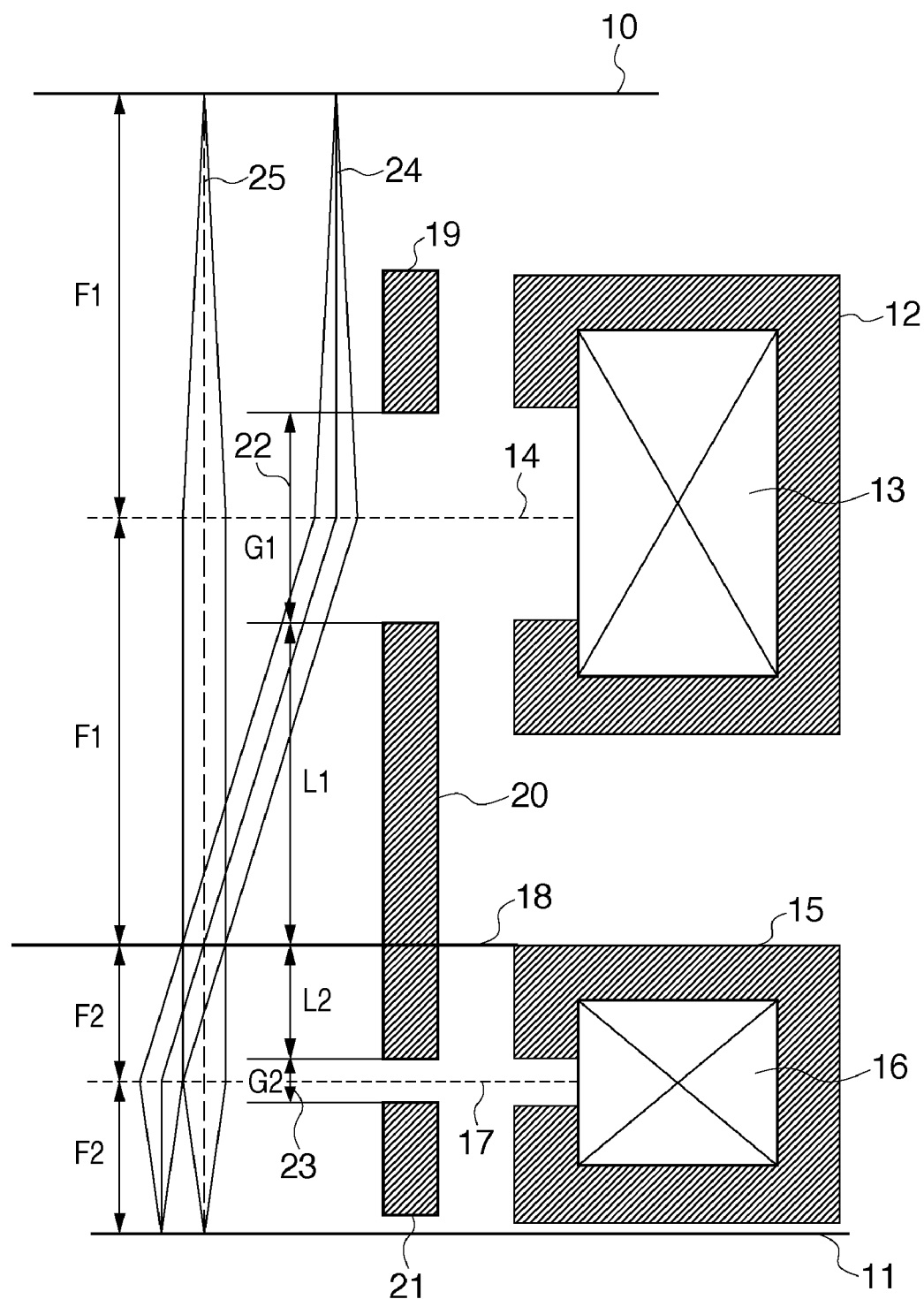
FIG. 1 is a schematic sectional view illustrating an example of a charged-particle beam exposure apparatus according to the present invention.

FIG. 1 is a schematic sectional view showing a charged-particle beam lithography apparatus, which images a pattern on a substrate via a projection system, using a charged-particle beam according to an embodiment of the present invention. The projection system of the charged-particle beam lithography apparatus comprises a symmetrical magnetic double lens, and an electro-static lens with an electrical field superimposed on a magnetic field generated by the symmetrical magnetic doublet lens. The symmetrical magnetic doublet lens includes an upper magnetic lens 12 and a lower magnetic lens 15. The electro-static lens is a unipotential electro-static lens, which includes three cylindrical electrodes, that is, a first cylindrical electrode 19, a second cylindrical electrode 20, and a third cylindrical electrode 21, in turn, from the side of an object plane 10 to the side of an image plane 11. Although the charged-particle beam lithography apparatus in this embodiment is an electron beam lithography apparatus, the present invention is also applicable to other charged-particle beam lithography apparatuses, such as an ion beam lithography apparatus.

The second cylindrical electrode 20 is disposed between a central position 14 of the upper magnetic lens 12 in the vertical direction and a central position 17 of the lower magnetic lens 15 in the vertical direction in the symmetrical magnetic doublet lens. The strength of a magnetic field formed by the upper magnetic lens 12 and lower magnetic lens 15 is a maximum at the two central positions 14 and 17. The second cylindrical electrode 20 has a length defined such that its upper end is located higher than the lower end of the upper magnetic lens 12, and its lower end is located lower than the upper end of the lower magnetic lens 15. The second cylindrical electrode 20 lies on a pupil plane 18 of the symmetrical magnetic doublet lens and its vicinity. As is obvious from FIG. 1, the pupil plane 18 is set at a position at which the Coulomb effect is large, because an electron beam 25 on the axis and an electron beam 24 off the axis converge, so that the charge density of an electron beam is high.

Figure 3:
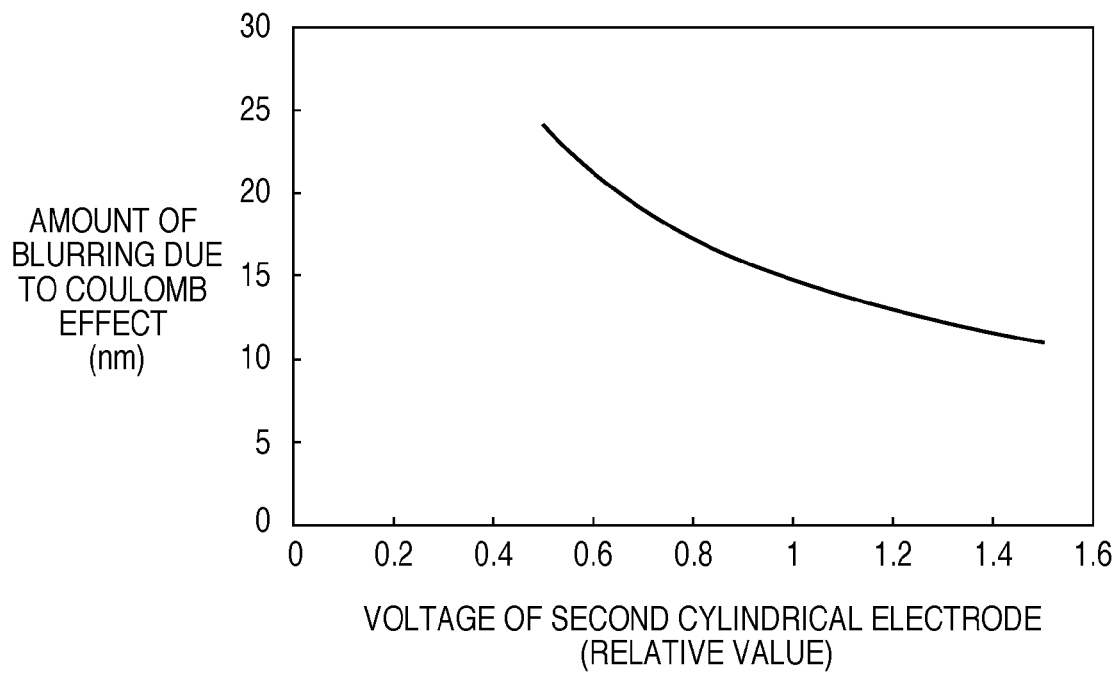
FIG. 3 is a graph showing the relationship between the potential of a second cylindrical electrode and the beam blurring due to the Coulomb effect.

FIG. 3 is a graph showing the relationship between the potential of the second cylindrical electrode 20 of the electrostatic lens and the blurring of a charged-particle beam due to the Coulomb effect. As the potential of the second cylindrical electrode 20 rises, the amount of blurring due to the Coulomb effect decreases. An amount of blurring 8 due to the Coulomb effect is generally give by:

$$\delta \propto L_c \times I/(V^{1.5} \times \alpha) \tag{1}$$

where $L_c$ is the distance between the object plane and the image plane, I is the beam current of a charged-particle beam, V is the acceleration potential of the charged-particle beam, and $\alpha$ is the convergent half-angle on the image plane.

An electron gun serving as the electron generation source can decrease the blurring δ by highly accelerating an electron beam, but this method has several demerits. Applying a highly-accelerated (high-energy) electron beam on a photosensitive substrate lowers the effective sensitivity of the photosensitive material. High acceleration by an electron gun requires a large-size electron optical lens, resulting in an increase in the optical path length $L_c$ and the blurring δ in expression (1). Highly-accelerated electrons scatter over a wider region on the photosensitive substrate, resulting in an increase in the proximity effect. On the other hand, when the potential of the second cylindrical electrode 20 is raised, as in the present invention, the term of the acceleration potential V in equation (1) rises. Since the blurring δ due to the Coulomb effect then decreases, there is no problem as in the above-described case, in which an electron gun highly accelerates an electron beam.

Figure 2:
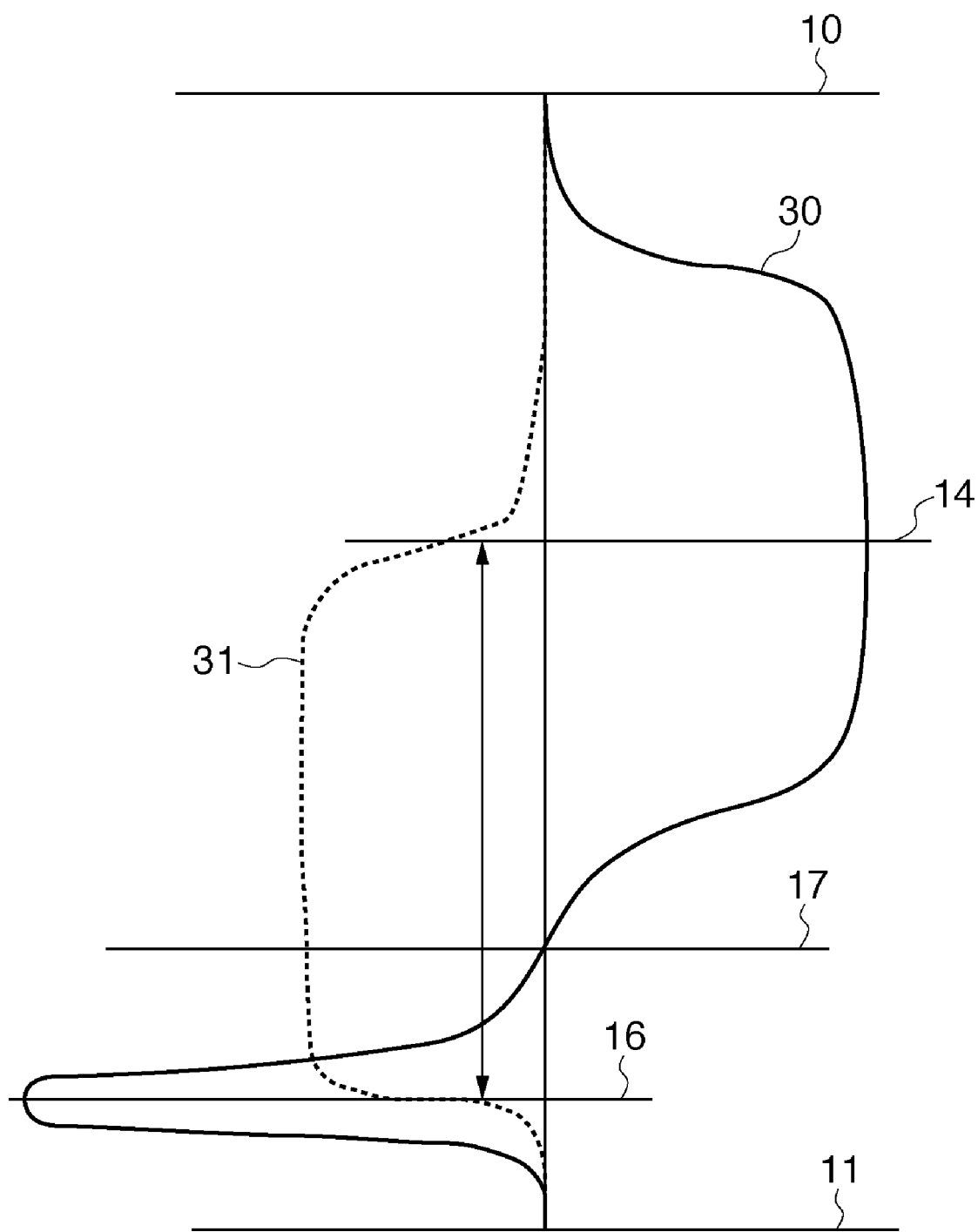
FIG. 2 is a chart showing the magnetic field distribution on the axis of a symmetrical magnetic doublet lens, and the potential distribution on the axis of an electro-static lens.

FIG. 2 shows a potential distribution 31 on the axis of the electro-static lens according to this embodiment. As shown in the potential distribution 31 on the axis, the second cylindrical electrode 20, which determines the potential of at least the pupil plane 18 of the symmetrical magnetic doublet lens or its vicinity, is applied with a potential higher than that which determines the energy of a charged-particle beam that has entered the symmetrical magnetic doublet lens. With this operation, a decelerating electrical field is generated between the second cylindrical electrode 20 and the third cylindrical electrode 21. This decelerating electrical field reduces the aberration of the symmetrical magnetic doublet lens of the projection lens. The first cylindrical electrode 19, disposed on the object plane side, and the third cylindrical electrode 21, disposed on the image plane side, are grounded to have the same potential as that of the substrate. Since there are no electrical fields between the substrate and the first cylindrical electrode 19 and the third cylindrical electrode 21, the second cylindrical electrode 20 is applied with a potential higher than that of the substrate. For this reason, no disturbance of the decelerating electrical field occurs due to factors associated with, for example, the shape of the substrate surface and a member disposed on the stage, unlike the conventional optical system using a decelerating electrical field. This prevents degradation in resolving performance upon the generation of parasitic aberration.

Figure 4:
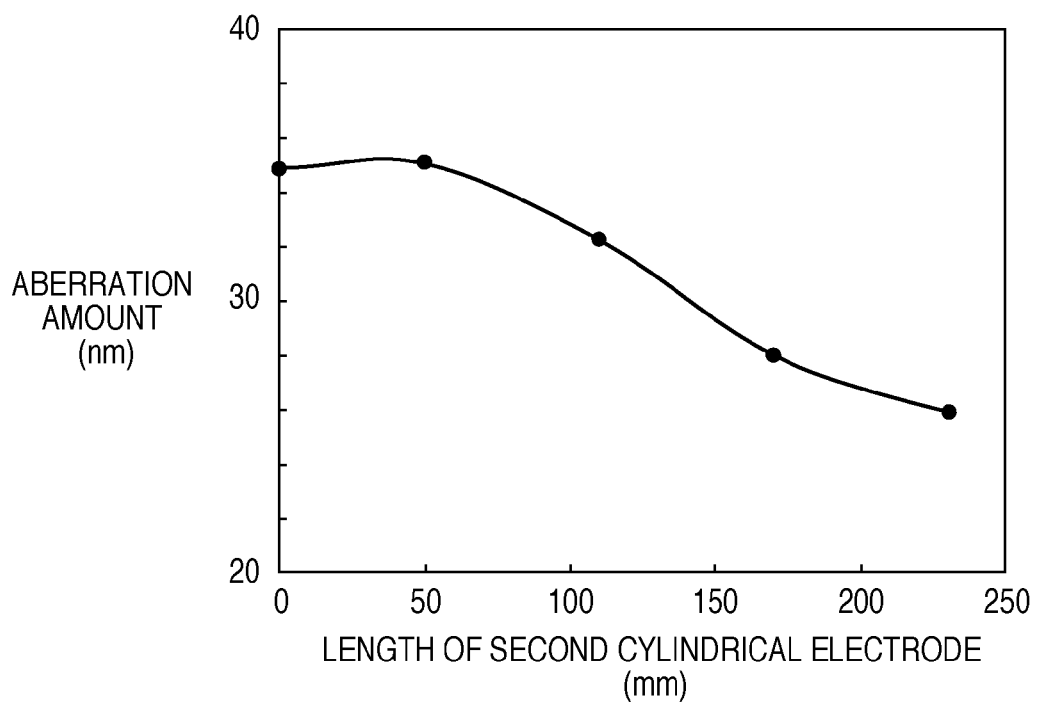
FIG. 4 is a graph showing the relationship between the length of the second cylindrical electrode and the beam blurring due to geometrical lens aberration.

FIG. 4 shows the relationship between the length of the second cylindrical electrode 20 and the geometrical aberration of the symmetrical magnetic doublet lens serving as the projection lens. As shown in FIG. 4, as the length of the second cylindrical electrode 20 exceeds 100 mm, the geometrical aberration remarkably decreases. This shows an effect of aberration reduction by a decelerating electrical field.

In this embodiment, the projection lens is an optical system formed by a symmetrical magnetic doublet lens. In an optical system of this type, the magnetic field strength and full width at half maximum of the magnetic field distribution of the upper magnetic lens 12 and lower magnetic lens 15 have preset ratios. Since an anisotropic component of optical aberration is canceled, this optical system is suited to a relatively large angle of view.

When an electro-static lens with an electrical field is superimposed on a magnetic field generated by a symmetrical magnetic doublet lens, it is necessary to set the lengths and disposition of cylindrical electrodes of the electrostatic lens so as not to degrade the aberration characteristic of the symmetrical magnetic doublet lens. The central position of a gap 22 between the first cylindrical electrode 19 and the second cylindrical electrode 20 is matched with the central position 14 of the gap between the magnetic poses of the upper magnetic lens 12. In addition, the central position of a gap 23 between the second cylindrical electrode 20 and the third cylindrical electrode 21 is matched with the central position 17 of the gap between the magnetic poses of the lower magnetic lens 15.

The ratio between a distance L1 from the upper end of the second cylindrical electrode 20 to the pupil plane 18 of the symmetrical magnetic doublet lens, and a distance L2 from the lower end of the second cylindrical electrode 20 to the pupil plane 18 of the symmetrical magnetic doublet lens is set to satisfy:

$$L2/L1 = M \tag{2}$$

When the second cylindrical electrode 20 is disposed to satisfy expression (2), the rotation angles of images of the upper magnetic lens 12 and lower magnetic lens 15 become equal to each other. Since the images do not rotate under this condition, no anisotropic aberration occurs. This prevents degradation in the optical characteristic of the symmetrical magnetic doublet lens.

A device manufacturing method using the above-described charged-particle beam lithography apparatus will be exemplified next.

Devices (e.g., a semiconductor integrated circuit device and a liquid crystal display device) are manufactured by a pattern imaging step of imaging a pattern on a substrate using the charged-particle lithography apparatus according to the above-described embodiment, a developing step of developing the substrate on which the pattern is imaged in the pattern imaging step, and other known steps (e.g., etching, resist removal, dicing, bonding, and packaging steps) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A charged-particle beam lithography apparatus comprising:
   a projection system which projects a charged-particle beam, and images a pattern on a substrate with the projected charged-particle beam, wherein:
   (i) the projection system comprises a symmetrical magnetic doublet lens configured to generate a magnetic field, and an electro-static lens configured to generate an electrical field superimposed on the magnetic field,
   (ii) the electro-static lens includes first to third cylindrical electrodes, the first cylindrical electrode being disposed between an object plane and a pupil plane of the symmetrical magnetic doublet lens, the third cylindrical electrode being disposed between the pupil plane and an image plane of the symmetrical magnetic doublet lens, and the second cylindrical electrode being disposed between the first cylindrical electrode and the third cylindrical electrode, and
   (iii) a potential substantially equal to a potential of the substrate is applied to the first cylindrical electrode and to the third cylindrical electrode, and a potential for accelerating a charged-particle beam that is incident toward the pupil plane and for decelerating a charged-particle beam that exits from the pupil plane is applied to the second cylindrical electrode.

2. An apparatus according to claim 1, wherein the second cylindrical electrode is disposed between a center of an upper magnetic lens of the symmetrical magnetic doublet lens in a vertical direction, and a center of a lower magnetic lens of the symmetrical magnetic doublet lens in the vertical direction.

3. An apparatus according to claim 1, wherein the second cylindrical electrode is configured such that an upper end of the second cylindrical electrode is located higher than a lower end of an upper magnetic lens of the symmetrical magnetic doublet lens, and a lower end of the second cylindrical electrode is located lower than an upper end of a lower magnetic lens of the symmetrical magnetic doublet lens.

4. An apparatus according to claim 1, wherein the second cylindrical electrode is disposed such that a ratio between a distance from the upper end of the second cylindrical electrode to the pupil plane and a distance from the lower end of the second cylindrical electrode to the pupil plane is substantially equal to a magnification of the symmetrical magnetic doublet lens.

5. A method of manufacturing a device, the method comprising:
   imaging a pattern on a substrate using a charged-particle beam lithography apparatus defined in claim 1;
   developing the substrate on which the pattern is imaged; and
   processing the developed substrate to manufacture the device.

* * * * *